United States Patent
Hatanaka et al.

(10) Patent No.: US 12,222,379 B2
(45) Date of Patent: Feb. 11, 2025

(54) MEASURING INSTRUMENT AND MEASURING METHOD

(71) Applicant: Tokyo Electron Limited, Tokyo (JP)

(72) Inventors: Takayuki Hatanaka, Miyagi (JP); Kimihiro Yokoyama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 142 days.

(21) Appl. No.: 18/145,663

(22) Filed: Dec. 22, 2022

(65) Prior Publication Data
US 2023/0204643 A1 Jun. 29, 2023

(30) Foreign Application Priority Data

Dec. 27, 2021 (JP) ................. 2021-212612

(51) Int. Cl.
*G01R 27/26* (2006.01)
*H01J 37/32* (2006.01)

(52) U.S. Cl.
CPC .... *G01R 27/2605* (2013.01); *H01J 37/32917* (2013.01); *H01J 2237/24564* (2013.01)

(58) Field of Classification Search
CPC ............. G01R 27/2605; G01R 29/12; H01J 37/32917; H01J 2237/24564; H01J 37/32174; H01J 37/32715; H01J 37/32935; G01B 7/003; G01B 7/001; G01B 7/30

USPC ........................................... 324/688
See application file for complete search history.

(56) References Cited

U.S. PATENT DOCUMENTS

2020/0158676 A1 * 5/2020 Inoue .................. G01N 27/228

FOREIGN PATENT DOCUMENTS

CN 105264680 A * 1/2016 ............ C04B 35/45
JP 2017-003557 A 1/2017

* cited by examiner

*Primary Examiner* — Tung X Nguyen
*Assistant Examiner* — Robert P Alejnikov, Jr.
(74) *Attorney, Agent, or Firm* — Studebaker & Brackett PC

(57) ABSTRACT

A measuring instrument according to an exemplary embodiment includes a base board, at least one sensor chip provided on the base board, and a circuit board provided on the base board. The at least one sensor chip includes a sensor unit including a signal electrode having a front surface intersecting the base board in a radial direction, a guard electrode disposed on a rear side of the signal electrode, and a first ground electrode disposed on a rear side of the guard electrode. The at least one sensor chip includes a second ground electrode extending along a lower surface of the sensor unit. A space between the second ground electrode and the sensor unit is filled with an insulating material.

14 Claims, 13 Drawing Sheets

MEASURING INSTRUMENT AND MEASURING METHOD

CROSS-REFERENCE TO RELATED APPLICATIONS

This application claims the benefit of priority from Japanese Patent Application No. 2021-212612, filed on Dec. 27, 2021, the entire content of which is incorporated herein by reference.

TECHNICAL FIELD

Exemplary embodiments of the present disclosure relate to a measuring instrument.

BACKGROUND

Japanese Unexamined Patent Publication No. 2017-3557 discloses a measuring instrument having a sensor chip for measuring an electrostatic capacitance. This sensor chip includes a first electrode, a second electrode, and a third electrode. The first electrode has a first part. A second electrode has a second part extending onto the first part and insulated from the first electrode in the sensor chip. A third electrode has a front surface extending in a direction intersecting the first part and the second part, is provided on the first part and the second part, and is insulated from the first electrode and the second electrode in the sensor chip.

SUMMARY

In one exemplary embodiment, a measuring instrument is provided. The measuring instrument includes a disc-shaped base board, at least one sensor chip on the base board, and a circuit board on the base board. The at least one sensor chip includes a sensor unit including a signal electrode having a front surface intersecting the base board in a radial direction, a guard electrode disposed on a rear side of the signal electrode while being spaced apart from the signal electrode and extending along the signal electrode, and a first ground electrode disposed on a rear side of the guard electrode. The circuit board includes a radio frequency oscillator configured to apply a radio frequency signal to each of the signal electrode and the guard electrode, and a C/V conversion circuit configured to generate a voltage signal according to an electrostatic capacitance formed by the signal electrode. The C/V conversion circuit has an amplifier circuit including an operational amplifier. The radio frequency oscillator is connected to a non-inversion input terminal of the operational amplifier so that the radio frequency signal applied to the guard electrode is input to the non-inversion input terminal, and is connected to an inversion input terminal of the operational amplifier so that the radio frequency signal applied to the signal electrode is input to the inversion input terminal. The at least one sensor chip includes a second ground electrode extending along a lower surface of the sensor unit. The signal electrode, the guard electrode, and the first ground electrode of the sensor unit all extend to a lower end of the sensor unit. A space between the second ground electrode and the sensor unit is filled with an insulating material.

DETAILED DESCRIPTION

Figure 1:
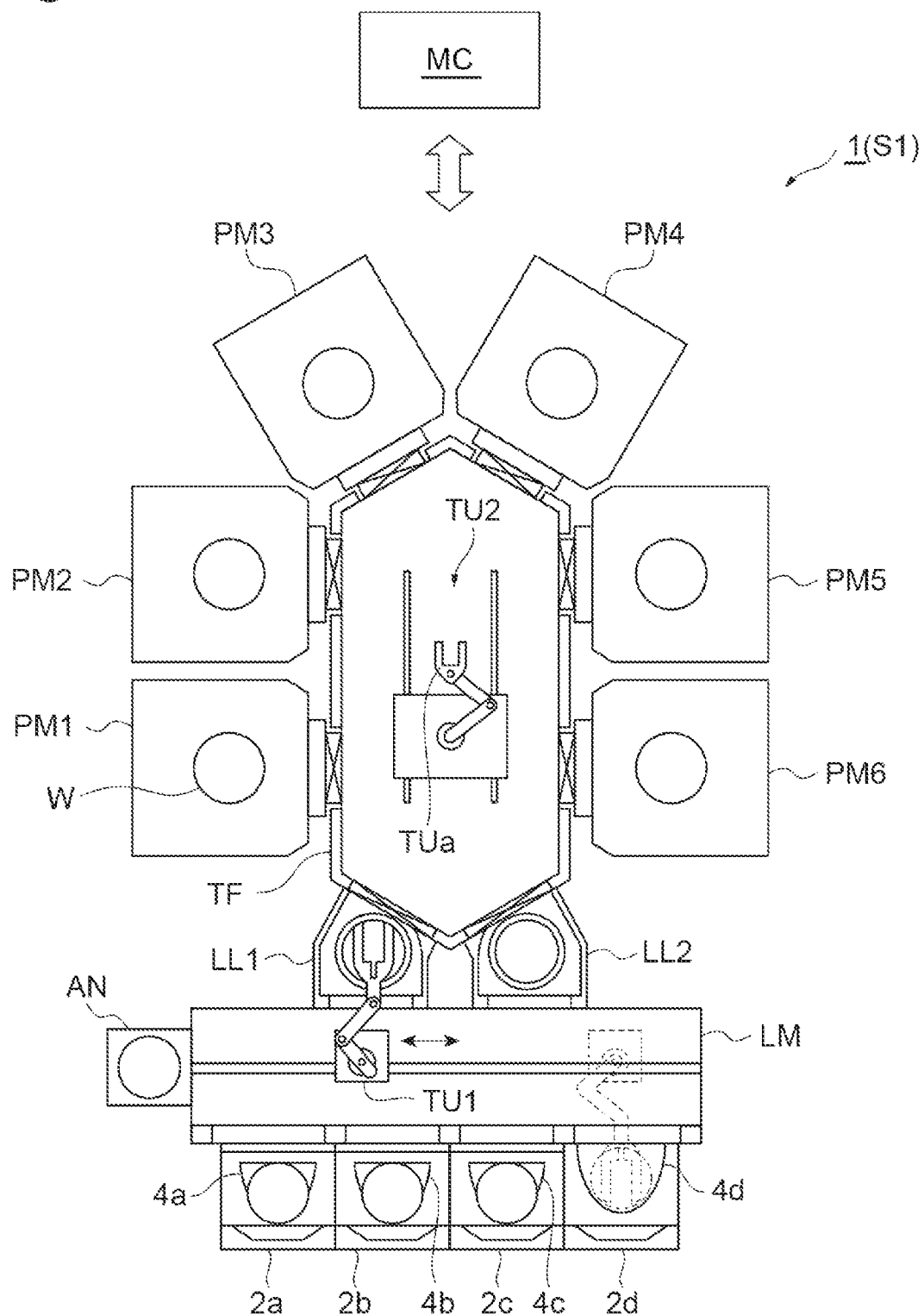
FIG. 1 is a diagram illustrating a processing system.

Hereinafter, various exemplary embodiments will be described.

In one exemplary embodiment, a measuring instrument is provided. The measuring instrument includes a disc-shaped base board, at least one sensor chip on the base board, and a circuit board on the base board. The at least one sensor chip includes a sensor unit including a signal electrode having a front surface intersecting the base board in a radial direction, a guard electrode disposed on a rear side of the signal electrode while being spaced apart from the signal electrode and extending along the signal electrode, and a first ground electrode disposed on a rear side of the guard electrode. The circuit board includes a radio frequency oscillator configured to apply a radio frequency signal to each of the signal electrode and the guard electrode, and a C/V conversion circuit configured to generate a voltage signal according to an electrostatic capacitance formed by the signal electrode. The C/V conversion circuit has an amplifier circuit including an operational amplifier. The radio frequency oscillator is connected to a non-inversion input terminal of the operational amplifier so that the radio frequency signal applied to the guard electrode is input to the non-inversion input terminal, and is connected to an inversion input terminal of the operational amplifier so that the radio frequency signal applied to the signal electrode is input to the inversion input terminal. The at least one sensor chip includes a second ground electrode extending along a lower surface of the sensor unit. The signal electrode, the guard electrode, and the first ground electrode of the sensor unit all extend to a lower end of the sensor unit. A space between the second ground electrode and the sensor unit is filled with an insulating material.

In the measuring instrument of the above embodiment, a rear side of the signal electrode is shielded by the guard electrode and the first ground electrode, and a lower side of the signal electrode is shielded by the second ground electrode. Therefore, according to the at least one sensor chip, it is possible to measure the electrostatic capacitance with high directivity in a specific direction, that is, in a direction in which a front surface of the signal electrode faces. In addition, since ESD for the guard electrode is suppressed, the ESD suppresses the operational amplifier from being broken via the guard electrode.

In one exemplary embodiment, the guard electrode constituting the sensor unit may not include a portion extending along the lower surface of the sensor unit.

In one exemplary embodiment, in a plan view, the front surface of the signal electrode, a front surface of the guard electrode, and a front surface of the first ground electrode may be all curved surfaces in parallel to a curved surface along an outer periphery of the base board.

In one exemplary embodiment, the at least one sensor chip may include a first flexible board extending along the lower surface of the sensor unit and including the second ground electrode.

In one exemplary embodiment, the at least one sensor chip may include a second flexible board extending along an upper surface of the sensor unit.

In one exemplary embodiment, the front surface of the signal electrode may be covered with an insulating material having insulating properties.

In one exemplary embodiment, the insulating material covering the front surface of the signal electrode may be made of borosilicate glass or quartz.

Hereinafter, various embodiments will be described in detail with reference to the drawings. The same reference numerals will be given to the same or corresponding parts in each drawing.

The measuring instrument according to one exemplary embodiment can be transported by a processing system 1 that has a function as a transport system S1. First, a processing system that includes a processing device for processing a workpiece and a transport device for transporting the workpiece to the processing device will be described. FIG. 1 is a diagram illustrating a processing system. The processing system 1 includes tables 2a to 2d, containers 4a to 4d, a loader module LM, an aligner AN, a load lock modules LL1 and LL2, a process modules PM1 to PM6, a transfer module TF, and a controller MC. The number of tables 2a to 2d, the number of containers 4a to 4d, the number of load lock modules LL1 and LL2, and the number of process modules PM1 to PM6 are not limited, and any number of equal to or greater than one can be used.

The tables 2a to 2d are arranged along one edge of the loader module LM. The containers 4a to 4d are mounted on the tables 2a to 2d, respectively. Each of the containers 4a to 4d is, for example, a container called a front opening unified pod (FOUP). Each of the containers 4a to 4d can be configured to accommodate the workpiece W. The workpiece W has a substantially disc shape like a wafer.

Inside of the loader module LM, there is a chamber wall that defines a transport space under atmospheric pressure. A transport device TU1 is provided in this transport space. The transport device TU1 is, for example, an articulated robot and is controlled by the controller MC. The transport device TU1 is configured to transport the workpiece W between the containers 4a to 4d and the aligner AN, between the aligner AN and the load lock modules LL1 to LL2, and between the load lock modules LL1 to LL2 and the containers 4a to 4d.

Figure 2:
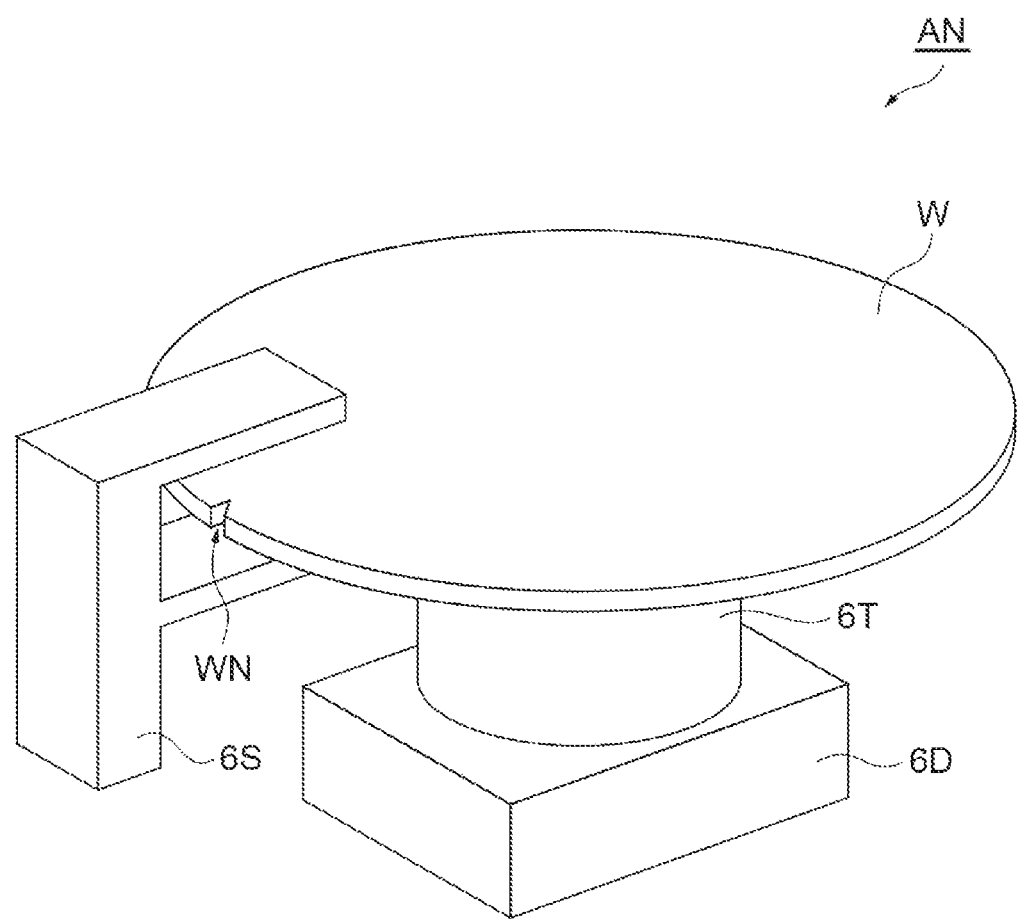
FIG. 2 is a perspective view illustrating an aligner.

The aligner AN is connected to the loader module LM. The aligner AN is configured to adjust the position of the workpiece W (calibrate the position). FIG. 2 is a perspective view illustrating an aligner. The aligner AN includes a support stand 6T, a drive device 6D, and a sensor 6S. The support stand 6T is a stand that can rotate around the axis extending in the vertical direction. The support stand 6T is configured to support the workpiece W. The support stand 6T is rotated by the drive device 6D. The drive device 6D is controlled by the controller MC. When the support stand 6T is rotated due to the power from the drive device 6D, the workpiece W placed on the support stand 6T is also rotated.

The sensor 6S is an optical sensor. The sensor 6S detects the edge of the workpiece W while the workpiece W is rotated. From the result of detecting the edge, the sensor 6S detects an amount of deviation of an angle position of a notch WN (or another marker) of the workpiece W with respect to a reference angle position and an amount of deviation of a center position of the workpiece W with respect to the reference position. The sensor 6S outputs the amount of deviation of the angle position of the notch WN and the amount of deviation of the center position of the workpiece W to the controller MC. The controller MC calculates an amount of rotation of the support stand 6T for correcting the angle position of the notch WN to the reference angle position based on the amount of deviation of the angle position of the notch WN. The controller MC controls the drive device 6D to rotate the support stand 6T as much as the amount of rotation. In this way, the angle position of the notch WN can be corrected to the reference angle position. In addition, the controller MC controls a position of an end effector of the transport device TU1 when receiving the workpiece W from the aligner AN based on the amount of deviation of the center position of the workpiece W. In this way, the center position of the workpiece W coincides with the predetermined position on the end effector of the transport device TU1.

Returning to FIG. 1, each of the load lock module LL1 and the load lock module LL2 is provided between the loader module LM and the transfer module TF. Each of the load lock module LL1 and the load lock module LL2 provides a preliminary decompression chamber.

The transfer module TF is air-tightly connected to the load lock module LL1 and the load lock module LL2 via a gate valve. The transfer module TF provides a decompression chamber capable of reducing pressure. A transport device TU2 is provided in this decompression chamber. The transport device TU2 is, for example, an articulated robot having a transport arm TUa. The transport device TU2 is controlled by the controller MC. The transport device TU2 is configured to transport the workpiece W between the load lock modules LL1 to LL2 and the process modules PM1 to PM6, and between any two process modules of the process modules PM1 to PM6.

The process modules PM1 to PM6 are air-tightly connected to the transfer module TF via the gate valve. Each of the process modules PM1 to PM6 is a processing device configured to perform a dedicated process such as plasma processing on the workpiece W.

A series of operations when the processing on the workpiece W is performed in the processing system 1 will be illustrated as follows. The transport device TU1 of the loader module LM takes out the workpiece W from any of the containers 4a to 4d and transports the workpiece W to the aligner AN. Subsequently, the transport device TU1 takes out the position adjusted workpiece W from the aligner AN, and transports the workpiece W to one of the load lock module LL1 and the load lock module LL2. Next, one load lock module reduces the pressure in the preliminary decompression chamber to a predetermined pressure. Next, the transport device TU2 of the transfer module TF takes out the workpiece W from one of the load lock modules and transports the workpiece W to any of the process modules PM1 to PM6. Then, one or more process modules among the process modules PM1 to PM6 perform processing on the workpiece W. Then, the transport device TU2 transports the processed workpiece W from the process module to one of the load lock module LL1 and the load lock module LL2. Next, the transport device TU1 transports the workpiece W from one of the load lock modules to any of the containers 4a to 4d.

This processing system 1 includes the controller MC as described above. The controller MC can be a computer including a processor, a storage device such as a memory, a display device, an input/output device, a communication device, and the like. The series of operations of the processing system 1 described above are realized by controlling each part of the processing system 1 by the controller MC according to the program stored in the storage device.

Figure 3:
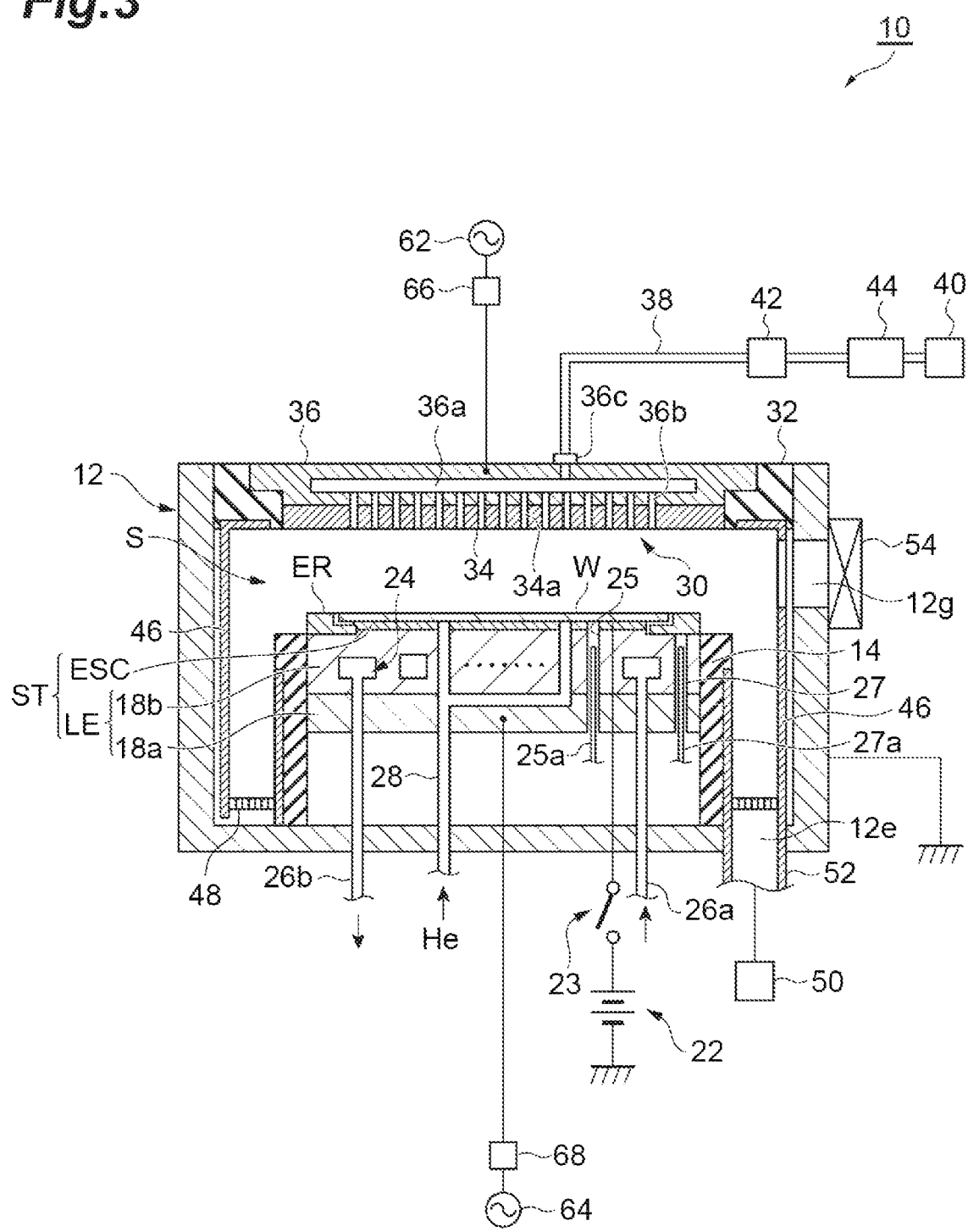
FIG. 3 is a diagram illustrating an example of a plasma processing device.

FIG. 3 is a diagram illustrating an example of a plasma processing device that can be adopted as any of the process modules PM1 to PM6. A plasma processing device 10 illustrated in FIG. 3 is a capacitance-coupling type plasma etching device. The plasma processing device 10 includes a chamber body 12 having a substantially cylindrical shape. The chamber body 12 is formed of, for example, aluminum, and the inner wall surface thereof may be anodized. This chamber body 12 is grounded for security.

A support portion 14 having a substantially cylindrical shape is provided on a bottom portion of the chamber body 12. The support portion 14 is formed of, for example, an insulating material. The support portion 14 is provided in the chamber body 12. The support portion 14 extends upward from the bottom portion of the chamber body 12. In addition, a stage ST is provided in a chamber S provided by the chamber body 12. The stage ST is supported by the support portion 14.

The stage ST includes a lower electrode LE and an electrostatic chuck ESC. The lower electrode LE includes a first plate 18a and a second plate 18b. The first plate 18a and the second plate 18b are formed of a metal such as aluminum, and have a substantially disc shape. The second plate 18b is provided on the first plate 18a and is electrically connected to the first plate 18a.

The electrostatic chuck ESC is provided on the second plate 18b. The electrostatic chuck ESC has a structure in which an electrode, which is a conductive film, is disposed between a pair of insulating layers or insulating sheets, and has a substantially disc shape. A DC power supply 22 is electrically connected to the electrode of the electrostatic chuck ESC via a switch 23. This electrostatic chuck ESC adsorbs the workpiece W by an electrostatic force such as a Coulomb force generated by a DC voltage from the DC power supply 22. In this way, the electrostatic chuck ESC can hold the workpiece W.

An edge ring ER is provided on a peripheral edge of the second plate 18b. This edge ring ER is provided to surround the edge of the workpiece W and the electrostatic chuck ESC. The edge ring ER has a first part P1 and a second part P2 (refer to FIG. 7). The first part P1 and the second part P2 have an annular plate shape. The second part P2 is a portion outside the first part P1. The second part P2 has a larger thickness in the height direction than the first part P1. An inner edge P2i of the second part P2 has a diameter larger than a diameter of an inner edge P1i of the first part P1. The workpiece W is mounted on the electrostatic chuck ESC so that the edge region is positioned on the first part P1 of the edge ring ER. The edge ring ER can be formed of any of various materials such as silicon, silicon carbide, and silicon oxide.

A refrigerant flow path 24 is provided inside the second plate 18b. The refrigerant flow path 24 constitutes a temperature control mechanism. Refrigerant is supplied to the refrigerant flow path 24 from a chiller unit provided outside the chamber body 12 via a pipe 26a. The refrigerant supplied to the refrigerant flow path 24 is returned to the chiller unit via the pipe 26b. As described above, the refrigerant is circulated between the refrigerant flow path 24 and the chiller unit. The temperature of the workpiece W supported by the electrostatic chuck ESC is controlled by controlling the temperature of this refrigerant.

A plurality of (for example, three) through holes 25 penetrating the stage ST are formed in the stage ST. The plurality of through holes 25 are formed inside the electrostatic chuck ESC in a plan view. A lift pin 25a is inserted into each of the through holes 25. In FIG. 3, one through hole 25 into which one lift pin 25a is inserted is drawn. The lift pin 25a is provided to be vertically movable in the through hole 25. When the lift pin 25a rises, the workpiece W supported on the electrostatic chuck ESC rises.

In the stage ST, a plurality of (for example, three) through holes 27 penetrating the stage ST (lower electrode LE) are formed at a position outside the electrostatic chuck ESC in a plan view. The lift pin 27a is inserted into each of these through holes 27. In FIG. 3, one through hole 27 into which one lift pin 27a is inserted is drawn. The lift pin 27a is provided to be vertically movable in the through hole 27. When the lift pin 27a rises, the edge ring ER supported on the second plate 18b rises.

In addition, a gas supply line 28 is provided in the plasma processing device 10. The gas supply line 28 supplies heat transfer gas from a heat transfer gas supply mechanism, such as He gas, to a place between the upper surface of the electrostatic chuck ESC and the back surface of the workpiece W.

In addition, the plasma processing device 10 includes an upper electrode 30. The upper electrode 30 is disposed above the stage ST to face the stage ST. The upper electrode 30 is supported on the upper portion of the chamber body 12 via an insulating shielding member 32. The upper electrode 30 can include a top plate 34 and a support 36. The top plate 34 faces the chamber S. The top plate 34 is provided with a plurality of gas discharge holes 34a. The top plate 34 can be formed of silicon or quartz. Alternatively, the top plate 34 may be configured by forming a plasma resistant film such as yttrium oxide on the surface of the aluminum base material.

The support 36 detachably supports the top plate 34. The support 36 may be formed of a conductive material such as aluminum. The support 36 can have a water-cooled structure. A gas diffusion chamber 36a is provided inside the support 36. A plurality of gas flow holes 36b communicating with the gas discharge hole 34a extend downward from this gas diffusion chamber 36a. In addition, a gas introduction port 36c for guiding the processing gas into the gas diffusion chamber 36a is formed in the support 36. A gas supply pipe 38 is connected to the gas introduction port 36c.

A gas source group 40 is connected to the gas supply pipe 38 via a valve group 42 and a flow rate controller group 44. The gas source group 40 includes a plurality of gas sources for a plurality of types of gases. The valve group 42 includes a plurality of valves, and the flow rate controller group 44 includes a plurality of flow rate controllers such as mass flow controllers. The plurality of gas sources of the gas source group 40 are connected to the gas supply pipe 38 via the corresponding valve of the valve group 42 and the corresponding flow rate controller of the flow rate controller group 44, respectively.

In addition, in the plasma processing device 10, a depot shield 46 is detachably provided along the inner wall of the chamber body 12. The depot shield 46 is also provided on the outer periphery of the support portion 14. The depot shield 46 prevents etching by-products (depots) from adhering to the chamber body 12. The depot shield 46 can be configured by covering an aluminum material with ceramics such as yttrium oxide.

An exhaust plate 48 is provided on the bottom portion side of the chamber body 12, and between the support portion 14 and the side wall of the chamber body 12. The exhaust plate 48 can be configured, for example, by covering an aluminum material with ceramics such as yttrium oxide. In the exhaust plate 48, a plurality of holes penetrating in the thickness direction are formed. An exhaust port 12e is provided below the exhaust plate 48 and on the chamber body 12. An exhaust device 50 is connected to the exhaust port 12e via an exhaust pipe 52. The exhaust device 50 includes a vacuum pump such as a pressure regulating valve and a turbo molecular pump. The exhaust device 50 can reduce the pressure of the space in the chamber body 12 to a desired degree of vacuum. In addition, the side wall of the chamber body 12 is provided with a carry-inlet/outlet 12g for the workpiece W. The carry-inlet/outlet 12g can be opened and closed by a gate valve 54.

In addition, the plasma processing device 10 further includes a first radio frequency power supply 62 and a second radio frequency power supply 64. The first radio frequency power supply 62 is a power supply that generates a first radio frequency for the plasma generation. The first radio frequency power supply 62 generates, for example, a radio frequency having a frequency of 27 to 100 MHz. The first radio frequency power supply 62 is connected to the upper electrode 30 via a matcher 66. The matcher 66 includes a circuit for matching an output impedance of the first radio frequency power supply 62 with an input impedance of the load side (upper electrode 30 side). The first radio frequency power supply 62 may be connected to the lower electrode LE via the matcher 66.

The second radio frequency power supply 64 is a power supply that generates a second radio frequency for drawing ions into the workpiece W. The second radio frequency power supply 64 generates, for example, a radio frequency with a frequency in the range of 400 kHz to 13.56 MHz. The second radio frequency power supply 64 is connected to the lower electrode LE via a matcher 68. The matcher 68 includes a circuit for matching an output impedance of the second radio frequency power supply 64 with an input impedance of the load side (lower electrode LE side).

In the plasma processing device 10, gas from one or more gas sources selected from the plurality of gas sources is supplied to the chamber S. In addition, the pressure in the chamber S is set to a predetermined pressure by the exhaust device 50. Further, the gas in the chamber S is excited by the first radio frequency from the first radio frequency power supply 62. As a result, the plasma is generated. Then, the workpiece W is processed by the generated active species. If necessary, ions may be drawn into the workpiece W by a bias based on the second radio frequency from the second radio frequency power supply 64.

Figure 4:
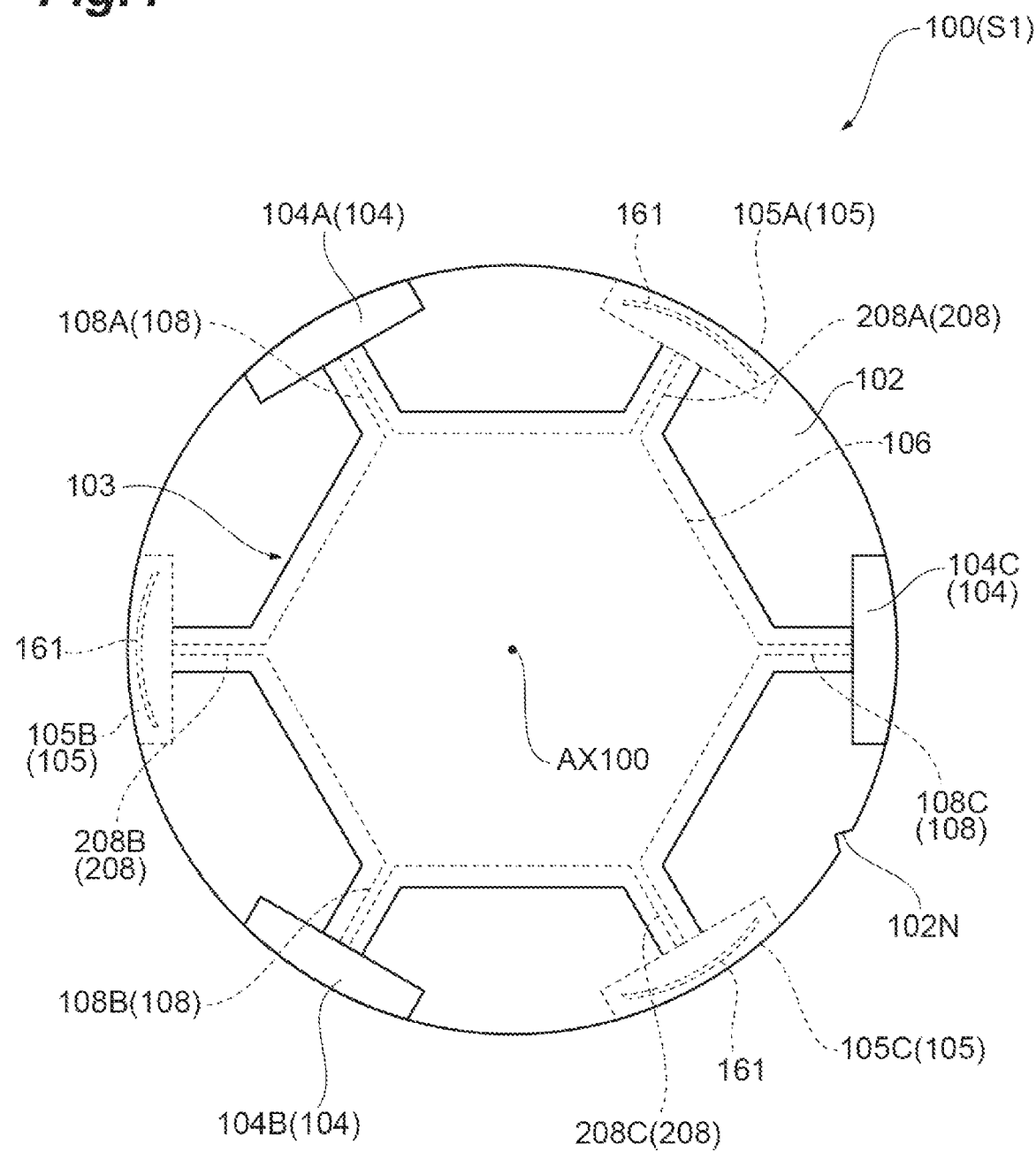
FIG. 4 is a plan view illustrating an example of a measuring instrument as viewed from a top surface side.
Figure 5:
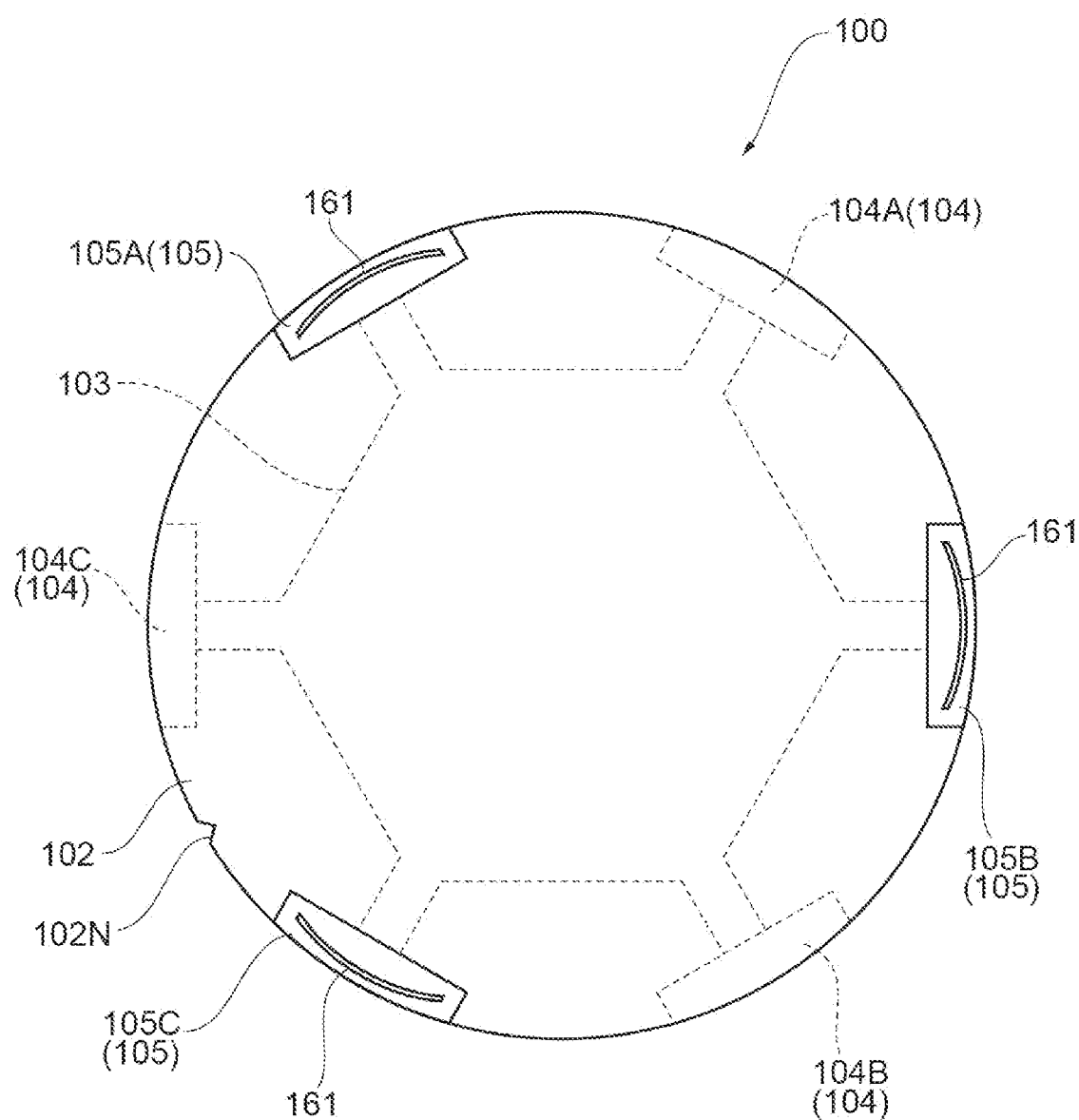
FIG. 5 is a plan view illustrating an example of the measuring instrument as viewed from a bottom surface side.

The measuring instrument will be described below. FIG. 4 is a plan view illustrating an example of a measuring instrument as viewed from a top surface side. FIG. 5 is a plan view illustrating an example of the measuring instrument as viewed from a bottom surface side. The measuring instrument 100 illustrated in FIGS. 4 and 5 includes a base board 102. The base board 102 is formed of, for example, silicon, and has a shape similar to a shape of the workpiece W, that is, a substantially disc shape. A diameter of the base board 102 is, for example, 300 mm, which is the same size as the diameter of the workpiece W. The shape and dimensions of the measuring instrument 100 are defined by the shape and dimensions of this base board 102. Therefore, the measuring instrument 100 has a shape similar to the shape of the workpiece W and has the same dimensions as the workpiece W. In addition, a notch 102N (or another marker) is formed on an edge of the base board 102.

A plurality of first sensors 104A to 104C are provided on the base board 102 for measuring an electrostatic capacitance. The plurality of first sensors 104A to 104C are arranged at equal intervals along the edge of the base board 102, for example, all around the edge. Specifically, each of the plurality of first sensors 104A to 104C is provided along the edge on the top surface side of the base board 102. The front end surfaces of each of the plurality of first sensors 104A to 104C are along the side surface of the base board 102.

In addition, a plurality of second sensors 105A to 105C for measuring an electrostatic capacitance are provided on the base board 102. The plurality of second sensors 105A to 105C are arranged at equal intervals along the edge of the base board 102, for example, all around the edge. Specifically, each of the plurality of second sensors 105A to 105C is provided along the edge on the bottom surface side of the base board. The signal electrode 161 of each of the plurality of second sensors 105A to 105C is along the bottom surface of the base board 102. In addition, the second sensors 105A to 105C and the first sensors 104A to 104C are alternately arranged at intervals of 60° in the circumferential direction.

A circuit board 106 is provided in the center of the upper surface of the base board 102. Wiring groups 108A to 108C are provided between the circuit board 106 and the plurality of first sensors 104A to 104C for electrically connecting each other. In addition, wiring groups 208A to 208C are provided between the circuit board 106 and the plurality of second sensors 105A to 105C for electrically connecting each other. The circuit board 106, the wiring groups 108A to 108C, and the wiring groups 208A to 208C are covered with a cover 103.

Figure 6:
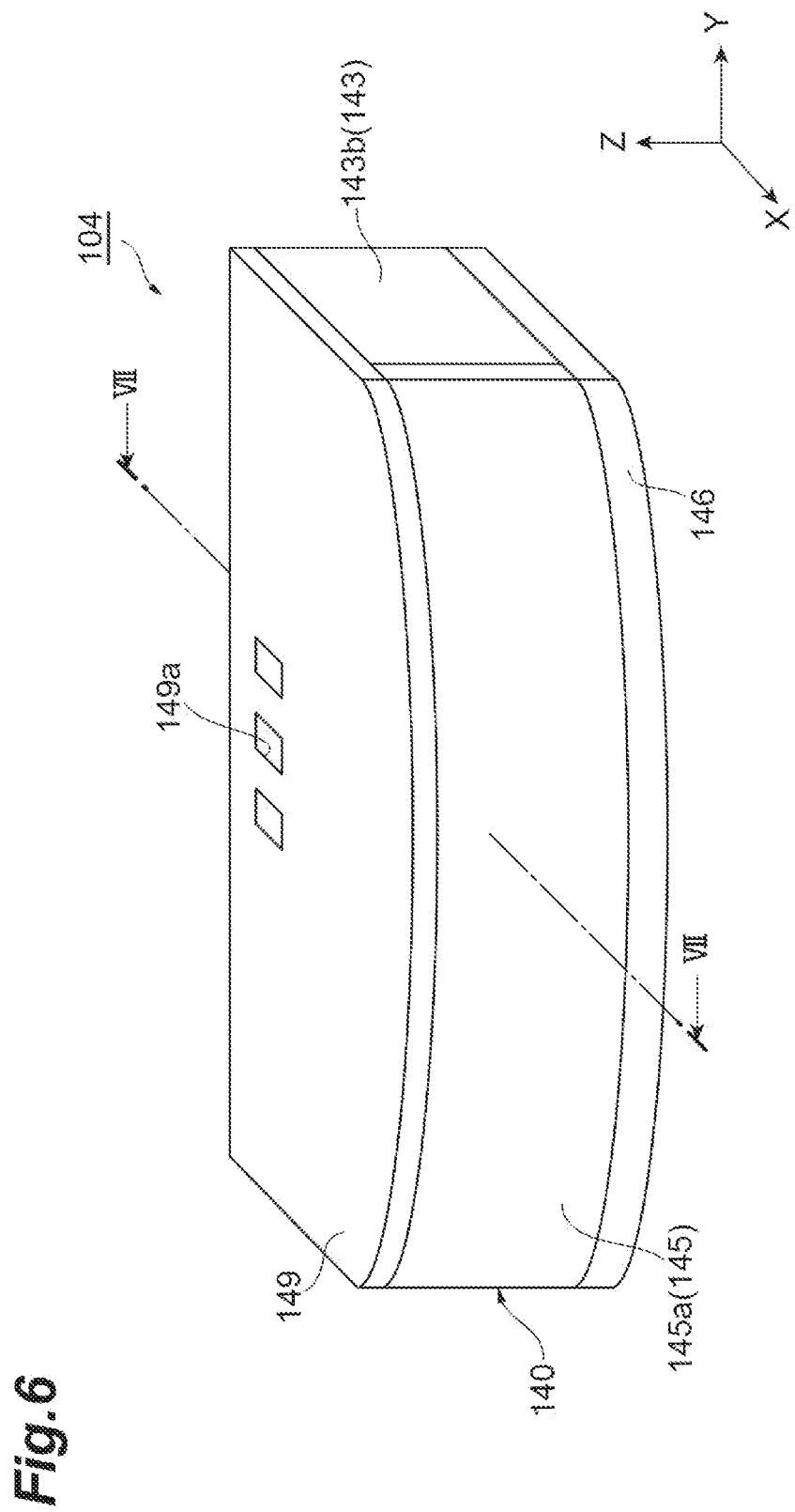
FIG. 6 is a perspective view illustrating an example of a first sensor.
Figure 7:
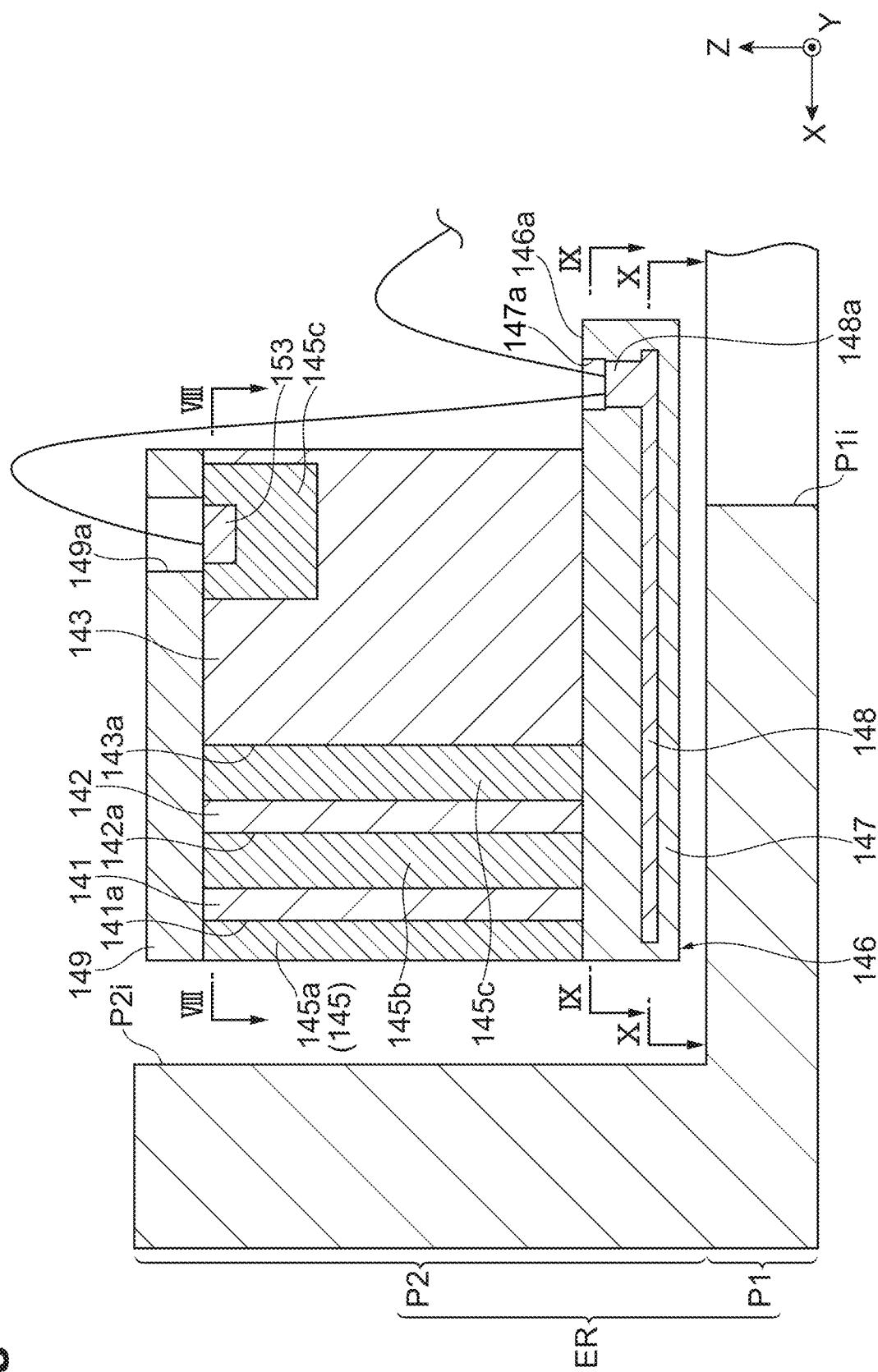
FIG. 7 is a sectional view taken along the line VII-VII in FIG. 6.
Figure 8:
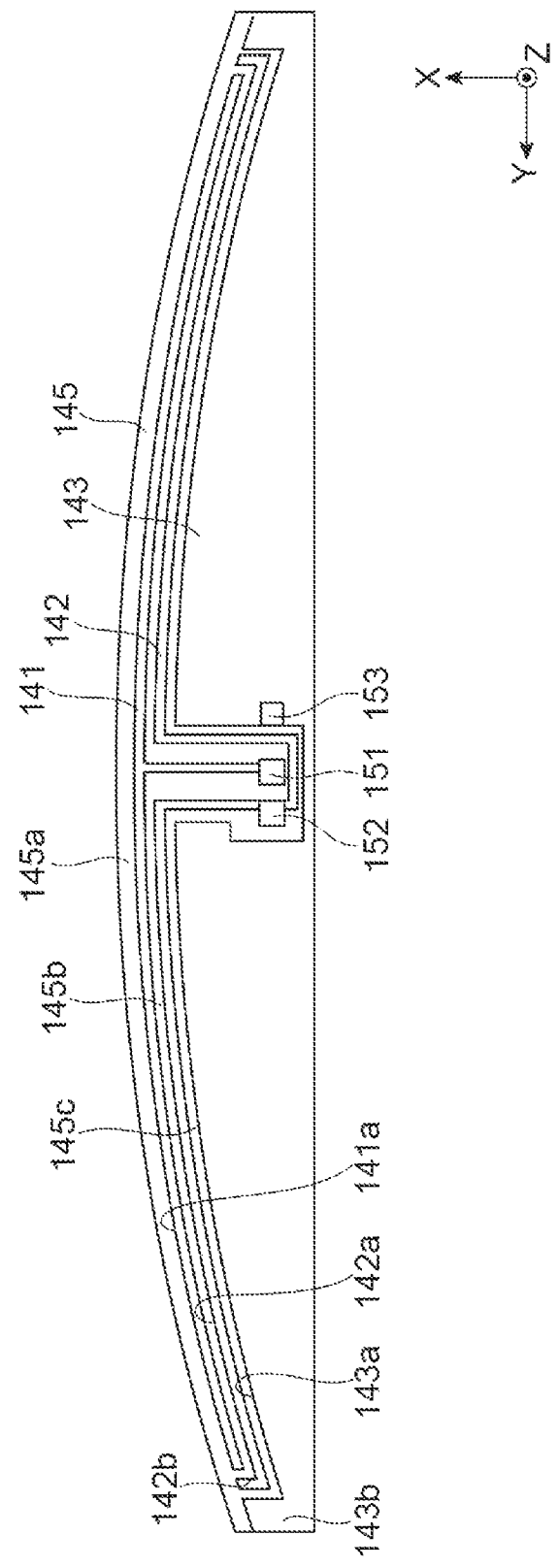
FIG. 8 is a sectional view taken along the line VIII-VIII in FIG. 7.
Figure 9:
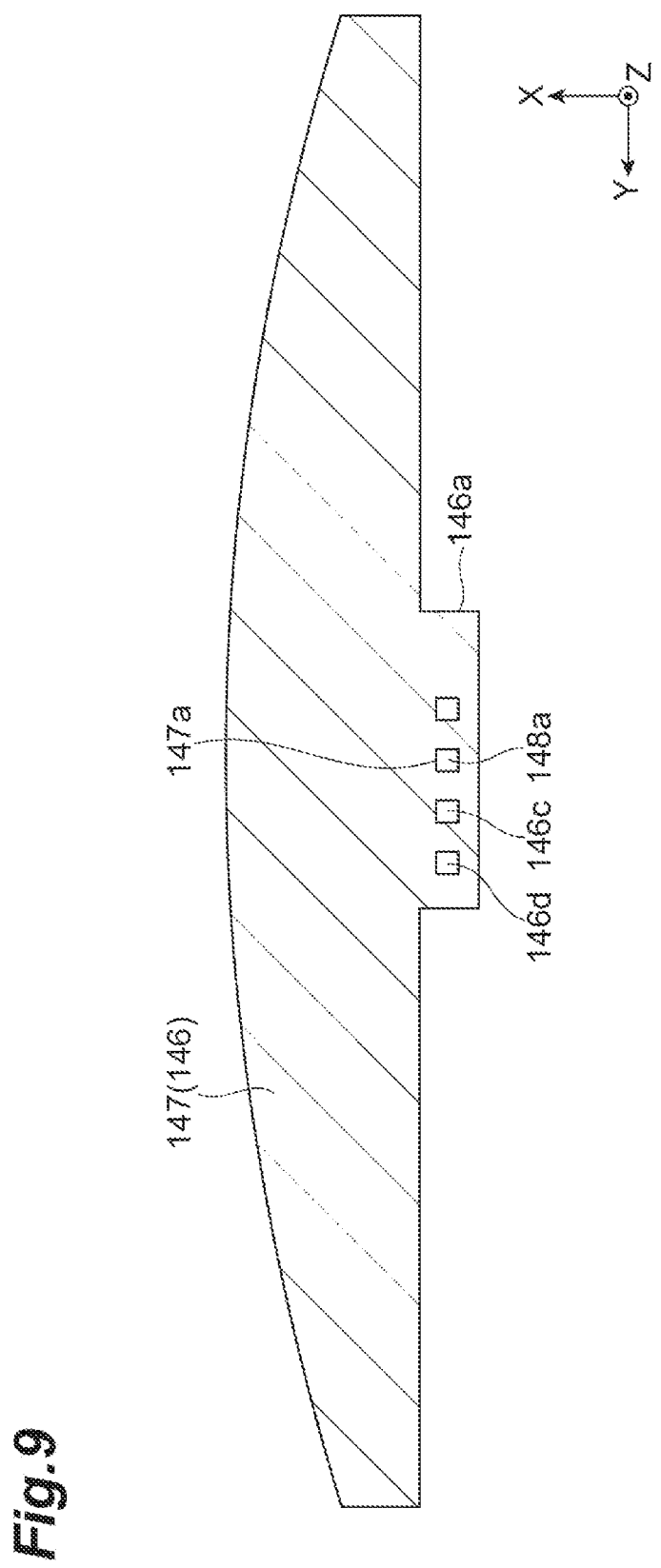
FIG. 9 is a sectional view taken along the line IX-IX in FIG. 7.
Figure 10:
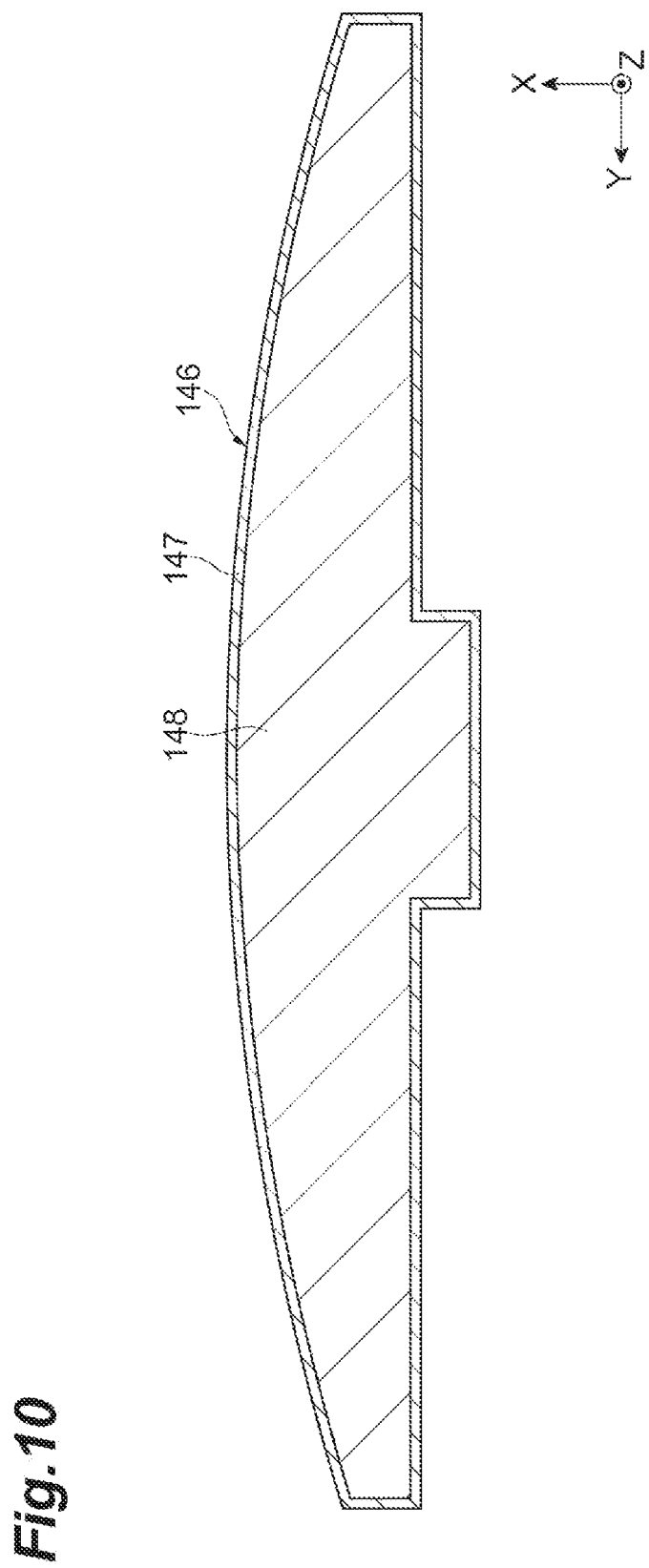
FIG. 10 is a sectional view taken along the line X-X in FIG. 7.

Hereinafter, the first sensor will be described in detail. FIG. 6 is a perspective view illustrating an example of the sensor. FIG. 7 is a sectional view taken along the line VII-VII in FIG. 6. FIG. 8 is a sectional view of the first sensor, taken along the line VIII-VIII in FIG. 7. FIG. 9 is a sectional view of the first sensor, taken along the line IX-IX in FIG. 7. FIG. 10 is a sectional view of the first sensor, taken along the line X-X in FIG. 7.

The first sensor (sensor chip) 104 is a sensor used as a plurality of first sensors 104A to 104C of the measuring instrument 100, and is configured as a chip-shaped component. In the description below, the XYZ rectangular coordinate system will be referred to as appropriate. The X-direction indicates a front direction of the first sensor 104, the Y-direction indicates a direction orthogonal to the X-direction and indicates the width direction of the first sensor 104, and the Z-direction indicates a direction orthogonal to the X-direction and the Y-direction, and indicates an upward direction of the first sensor 104. FIG. 7 illustrates the edge ring ER together with the first sensor 104.

The first sensor 104 includes a sensor body 140 (sensor unit), a first flexible board 146, and a second flexible board 149. The sensor body 140 includes a signal electrode 141, a guard electrode 142, and a first ground electrode 143. In one example, the sensor body 140 may be a micro electro mechanical system (MEMS) chip manufactured using a MEMS technology. For example, the signal electrode 141, the guard electrode 142, and the first ground electrode 143 can be formed of conductive materials such as copper and silicon.

The signal electrode 141 has a front surface 141*a* intersecting a radial direction of the base board 101. That is, the front surface 141*a* of the signal electrode 141 in the measuring instrument 100 refers to a surface outside the base board in the radial direction. In one example, the front surface 141*a* of the signal electrode 141 is curved along an outer periphery of the measuring instrument 100. For example, the front surface 141*a* of the signal electrode 141 has a constant curvature at any position of the front surface 141*a*, and the curvature is a reciprocal number of a distance between the central axis AX100 of the measuring instrument 100 and the front surface 141*a*. A pad 151 electrically connected to the signal electrode 141 is provided on an upper end of a sensor body 140.

The guard electrode 142 is disposed on a rear side of the signal electrode 141 while being spaced apart from the signal electrode 141. In addition, the guard electrode 142 extends along the signal electrode 141. As an example illustrated in the drawings, the guard electrode 142 includes an inner surface portion 142*a* curved along the signal electrode 141 and a side edge portion 142*b* surrounding an edge of the signal electrode 141 in a width direction. An inner surface portion 142*a* of the guard electrode 142 is curved like the signal electrode 141. For example, the inner surface portion 142*a* of the guard electrode 142 has a constant curvature at any position of the inner surface portion 142*a*, and the curvature is a reciprocal number of a distance between the central axis AX100 of the measuring instrument 100 and the inner surface portion 142*a*. The side edge portions 142*b* of the guard electrode 142 protrude forward from both ends of the inner surface portion 142*a* in a width direction, respectively. The side edge portion 142*b* is formed along the edge while being spaced apart from the edge of the signal electrode 141 in the width direction. A pad 152 electrically connected to the guard electrode 142 is provided on an upper end of the sensor body 140.

The first ground electrode 143 is disposed on a rear side of the guard electrode 142 while being spaced apart from the guard electrode 142. In addition, a front surface 143*a* of the first ground electrode 143 extends along the guard electrode 142. That is, the front surface 143*a* of the first ground electrode 143 is curved parallel to the guard electrode 142. For example, the front surface 143*a* of the first ground electrode 143 has a constant curvature at any position of the front surface 143*a*, and the curvature is a reciprocal number of a distance between the central axis AX100 of the measuring instrument 100 and the front surface 143*a*. In addition, the first ground electrode 143 includes a side edge portion 143*b* surrounding the side edge portion 142*b* of the guard electrode 142. The side edge portions 143*b* of the first ground electrode 143 protrude forward from both ends of the front surface 143*a* in a width direction, respectively. The side edge portion 143*b* is formed along the side edge portion 142*b* while being spaced apart from the side edge portion 142*b* of the guard electrode 142. A pad 153 electrically connected to the first ground electrode 143 is provided on an upper end of the sensor body 140.

In addition, an insulating material 145 having electrical insulating properties is disposed between each of the signal electrode 141, the guard electrode 142, and the first ground electrode 143, which are spaced apart from each other. As shown in the drawing, the insulating material 145 includes a front surface portion 145*a*, a first intermediate portion 145*b*, and a second intermediate portion 145*c*. The front surface portion 145*a* constitutes the front surface of the sensor body 140. That is, the front surface portion 145*a* covers the front surface 141*a* of the signal electrode 141, a front portion of the side edge portion 142*b* of the guard electrode 142, and a front portion of the side edge portion 143*b* of the first ground electrode 143. The first intermediate portion 145*b* is disposed between the signal electrode 141 and the guard electrode 142. In the illustrated example, the first intermediate portion 145*b* is also disposed between the pad 151 connected to the signal electrode 141 and the pad 152 connected to the guard electrode 142. The second intermediate portion 145*c* is disposed between the guard electrode 142 and the first ground electrode 143. In the illustrated example, the second intermediate portion 145*c* is also disposed between the pad 152 connected to the guard electrode 142 and the pad 153 connected to the first ground electrode 143. The insulating material 145 may be made of, for example, borosilicate glass, quartz, or the like.

As described above, in a plan view, the front surface 141*a* of the signal electrode 141, the front surface (inner surface portion 142*a*) of the guard electrode 142, and the front surface 143*a* of the first ground electrode 143 are all curved surfaces in parallel to a curved surface along an outer periphery of the base board 101. In addition, the signal electrode 141, the guard electrode 142, and the first ground electrode 143 all extend from an upper end to a lower end of the sensor body 140. The signal electrode 141, the guard electrode 142, and the first ground electrode 143 are disposed to be spaced apart from each other because the insulating material 145 extending from the upper end to the lower end of the sensor body 140 is interposed therebetween.

The first flexible board 146 extends along the lower surface of the sensor body 140 having a column shape. For example, the first flexible board 146 is fixed to the lower surface of the sensor body 140 by an adhesive member such as an adhesive having electrical insulating properties or an adhesive sheet. Thus, the lower surface of the sensor body 140 is electrically insulated from the outside. In addition, the first flexible board 146 includes a region having a planar shape similar to that of the sensor body 140, and a terminal region 146*a* protruding from the center of the rear end of the region to the rear side. An example of the first flexible board 146 includes a board body 147 and a second ground electrode 148. The board body 147 is formed of, for example, polyimide or the like having electrical insulating properties. The second ground electrode 148 is formed in a plate shape slightly smaller than the board body 147 and is covered with the board body 147. That is, the upper surface, lower surface and side surfaces of the second ground electrode 148 are all covered with the board body 147. The second ground electrode 148 may be formed of, for example, a conductive metal such as copper.

The second ground electrode 148 extends along the lower surface of the sensor body 140. Therefore, a space between the second ground electrode 148 and the sensor body 140 is filled only with the board body 147 having electrical insulating properties. The terminal region 146*a* is formed with an opening 147*a* in the board body 147, and has a part of the second ground electrode 148 exposed as a pad 148*a*. In addition, the terminal region 146*a* is formed with a pad 146*c* and a pad 146*d* corresponding to the signal electrode 141 and the guard electrode 142, respectively.

The second flexible board 149 has a planar shape similar to that of the sensor body 140 and extends along the upper surface of the sensor body 140. An example of the second flexible board 149 is formed of, for example, polyimide or the like having electrical insulating properties. Openings 149a corresponding to the pads 151 to 153 are formed in the second flexible board 149, so that the pads 151 to 153 are exposed to the outside. The second flexible board 149 may be fixed to the upper surface of the sensor body 140 by an adhesive member such as an adhesive having electrical insulating properties or an adhesive sheet. In this case, the upper surface of sensor body 140 is electrically insulated from the outside.

When the first sensor 104 is used as a sensor of the measuring instrument 100, as will be described later, the signal electrode 141 is connected to a wiring 181, the guard electrode 142 is connected to a wiring 182, and the first ground electrode 143 is connected to a wiring 183. In one example, the wiring connected to the pad 151 of the signal electrode 141 may be connected to the wiring 181 via the pad 146c. In addition, the wiring connected to the pad 152 of the guard electrode 142 may be connected to the wiring 182 via the pad 146d. In addition, the wiring connected to the pad 153 of the first ground electrode 143 may be connected to the wiring 183 via the pad 148a of the second ground electrode 148.

Figure 11:
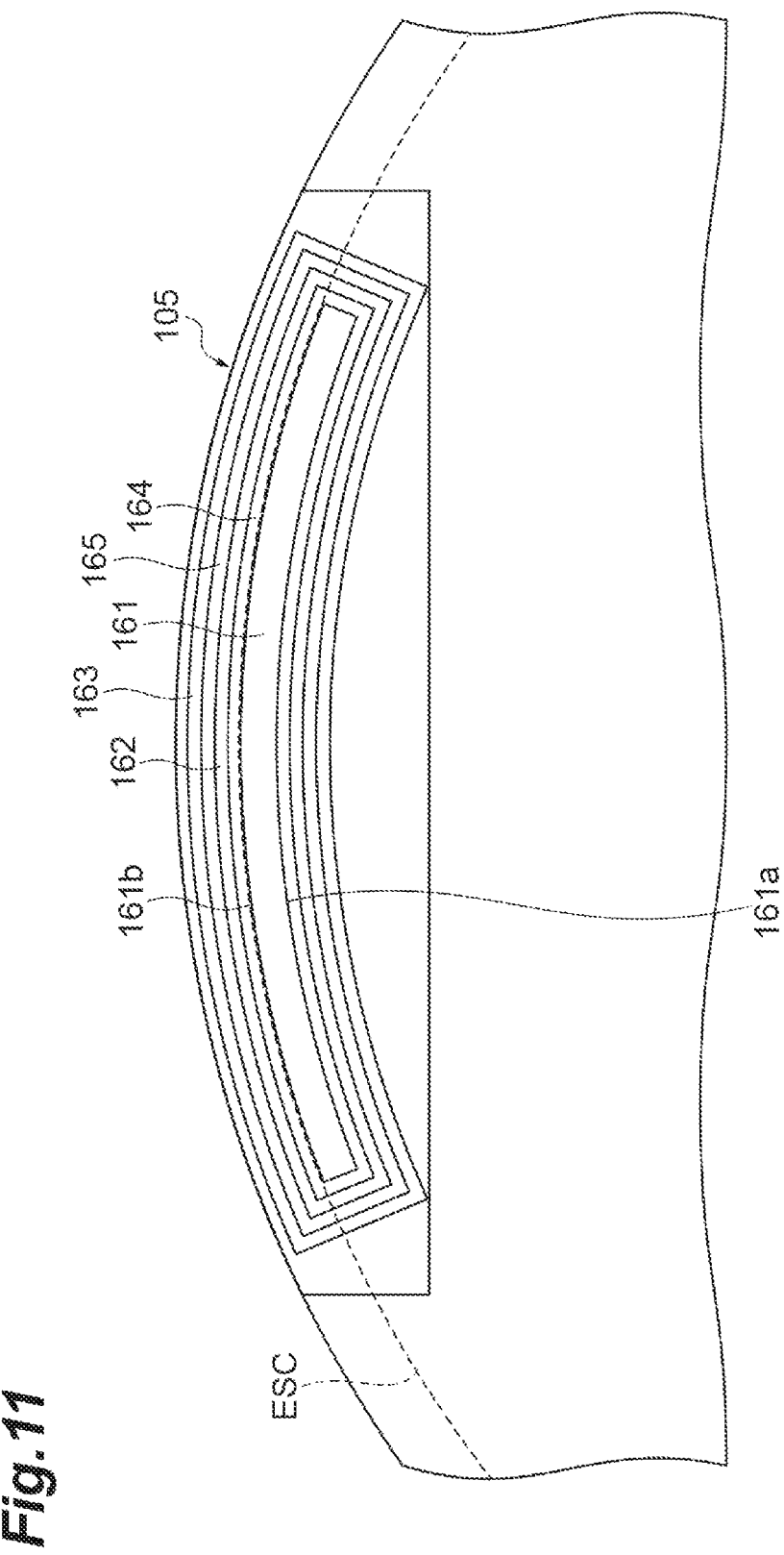
FIG. 11 is an enlarged view of the second sensor in FIG. 5.

Hereinafter, the second sensor will be described in detail. FIG. 11 is a partially enlarged view of FIG. 5, and illustrates one second sensor. The second sensor 105 includes a signal electrode 161. An edge of the signal electrode 161 has partially an arc shape. That is, the signal electrode 161 has a planar shape defined by an inner edge 161a and an outer edge 161b, which are two arcs having different radii with the central axis AX100 as a center. The outer edge 161b at the outside in the radial direction of each signal electrode 161 of the plurality of second sensors 105A to 105C extends on a common circle. In addition, the inner edge 161a at the inner side in the radial direction of each signal electrode 161 of the plurality of second sensors 105A to 105C extends on another common circle. The curvature of a part of the edge of the signal electrode 161 coincides with the curvature of the edge of the electrostatic chuck ESC. In an exemplary embodiment, the curvature of the outer edge 161b forming the edge at the outside in the radial direction of the signal electrode 161 coincides with the curvature of the edge of the electrostatic chuck ESC. The center of curvature of the outer edge 161b, that is, the center of the circle on which the outer edge 161b extends, shares the central axis AX100.

In an exemplary embodiment, the second sensor 105 further includes a guard electrode 162 that surrounds the signal electrode 161. The guard electrode 162 has a frame shape and surrounds the signal electrode 161 over the entire circumference. The guard electrode 162 and the signal electrode 161 are spaced apart from each other so that an insulating region 164 is interposed therebetween. In addition, in an exemplary embodiment, the second sensor 105 further includes an electrode 163 that surrounds the guard electrode 162 at the outside of the guard electrode 162. The electrode 163 has a frame shape and surrounds the guard electrode 162 over the entire circumference. The guard electrode 162 and the electrode 163 are spaced apart from each other so that an insulating region 165 is interposed therebetween.

Figure 12:
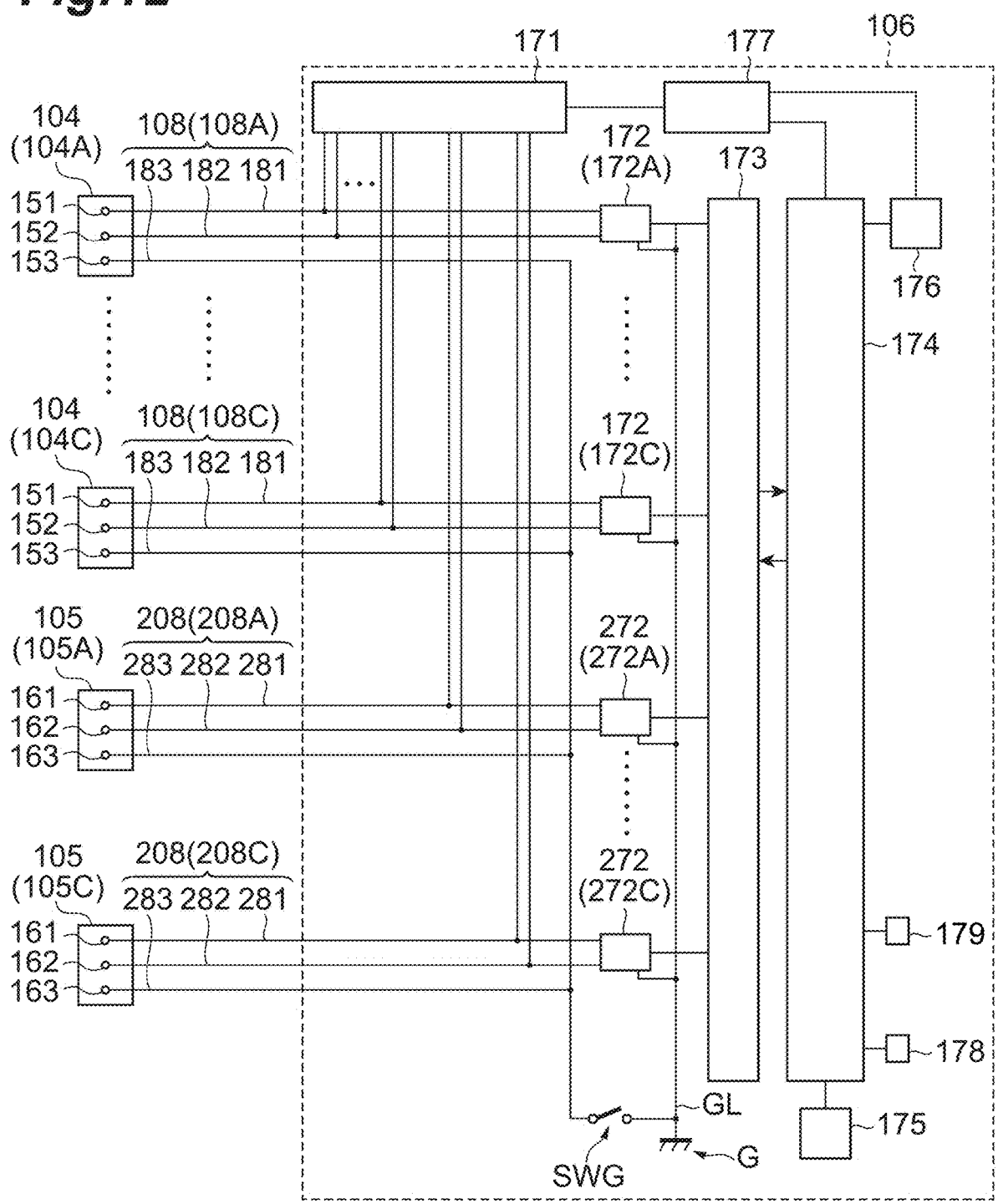
FIG. 12 is a diagram illustrating a configuration of a circuit board of the measuring instrument.

Hereinafter, the configuration of the circuit board 106 will be described. FIG. 12 is a diagram illustrating a configuration of a circuit board of the measuring instrument. The circuit board 106 includes a radio frequency oscillator 171, a plurality of C/V conversion circuits 172A to 172C, a plurality of C/V conversion circuits 272A to 272C, A/D converter 173, a processor 174, a storage device 175, a communication device 176, and a power supply 177. In an example, the arithmetic device is configured with the processor 174, the storage device 175, and the like. In addition, the circuit board 106 includes a temperature sensor 179. The temperature sensor 179 outputs a signal corresponding to the measured temperature to the processor 174. For example, the temperature sensor 179 can acquire the temperature of the environment around the measuring instrument 100.

Each of the plurality of first sensors 104A to 104C is connected to the circuit board 106 via the corresponding wiring group among the plurality of wiring groups 108A to 108C. In addition, each of the plurality of first sensors 104A to 104C is connected to the corresponding C/V conversion circuit among the plurality of C/V conversion circuits 172A to 172C via a couple of wirings included in the corresponding wiring group. Each of the plurality of second sensors 105A to 105C is connected to the circuit board 106 via the corresponding wiring group among the plurality of wiring groups 208A to 208C. In addition, each of the plurality of second sensors 105A to 105C is connected to the corresponding C/V conversion circuit among the plurality of C/V conversion circuits 272A to 272C via a couple of wirings included in the corresponding wiring group. Hereinafter, one first sensor 104 having the same configuration as each of the first sensors 104A to 104C, one wiring group 108 having the same configuration as each of the wiring groups 108A to 108C, and one C/V conversion circuit 172 having the same configuration as each of the C/V conversion circuits 172A to 172C, will be described. In addition, one second sensor 105 having the same configuration as each of the second sensors 105A to 105C, one wiring group 208 having the same configuration as each of the wiring groups 208A to 208C, and one C/V conversion circuit 272 having the same configuration as each of C/V conversion circuits 272A to 272C, will be described.

The wiring group 108 includes wirings 181 to 183. One end of the wiring 181 is electrically connected to the pad 151 connected to the signal electrode 141, and the other end of the wiring 181 is connected to the C/V conversion circuit 172. In addition, one end of the wiring 182 is electrically connected to the pad 152 connected to the guard electrode 142, and the other end of the wiring 182 is connected to the C/V conversion circuit 172. In addition, one end of the wiring 183 is electrically connected to the pad 153 which is electrically connected to the first ground electrode 143 and the second ground electrode 148. The wiring 183 is connected to a ground potential line GL connected to a ground G of the circuit board 106. The wiring 183 may be connected to the ground potential line GL via a switch SWG.

The wiring group 208 includes wirings 281 to 283. In addition, one end of the wiring 281 is electrically connected to the signal electrode 161, and the other end of the wiring 281 is connected to the C/V conversion circuit 272. In addition, one end of the wiring 282 is electrically connected to the guard electrode 162, and the other end of the wiring 282 is connected to the C/V conversion circuit 272. In addition, one end of the wiring 283 is connected to the electrode 163. The wiring 283 is electrically connected to the ground potential line GL connected to the ground GC of the circuit board 106. The wiring 283 may be connected to the ground potential line GL via the switch SWG.

The radio frequency oscillator 171 is connected to the power supply 177 such as a battery, and is configured to receive power from the power supply 177 to generate a radio frequency signal. The power supply 177 is also connected to the processor 174, the storage device 175, and the communication device 176. The radio frequency oscillator 171 includes a plurality of output lines. The radio frequency oscillator 171 applies the generated radio frequency signal to the wiring 181 and the wiring 182, and to the wiring 281 and the wiring 282 via the plurality of output lines. Therefore, the radio frequency oscillator 171 is electrically connected to the signal electrode 141 and the guard electrode 142 of the first sensor 104, and the radio frequency signal from the radio frequency oscillator 171 is applied to the signal electrode 141 and the guard electrode 142. In addition, the radio frequency oscillator 171 is electrically connected to the signal electrode 161 and the guard electrode 162 of the second sensor 105, and the radio frequency signal from the radio frequency oscillator 171 is applied to the signal electrode 161 and the guard electrode 162.

The wiring 181 connected to the pad 151 and the wiring 182 connected to the pad 152 are connected to the input of the C/V conversion circuit 172. That is, the guard electrode 142 and the signal electrode 141 of the first sensor 104 are connected to the input of the C/V conversion circuit 172. In addition, each of the signal electrode 161 and the guard electrode 162 is connected to the input of the C/V conversion circuit 272. The C/V conversion circuit 172 and the C/V conversion circuit 272 are configured to generate a voltage signal having an amplitude corresponding to the potential difference at the input, and output the voltage signal. The C/V conversion circuit 172 generates a voltage signal corresponding to the electrostatic capacitance formed by the corresponding first sensor 104. That is, as the electrostatic capacitance of the signal electrode connected to the C/V conversion circuit 172 increases, the magnitude of the voltage of the voltage signal output from the C/V conversion circuit 172 increases. Similarly, as the electrostatic capacitance of the signal electrode connected to the C/V conversion circuit 272 increases, the magnitude of the voltage of the voltage signal output from the C/V conversion circuit 272 increases.

Figure 13:
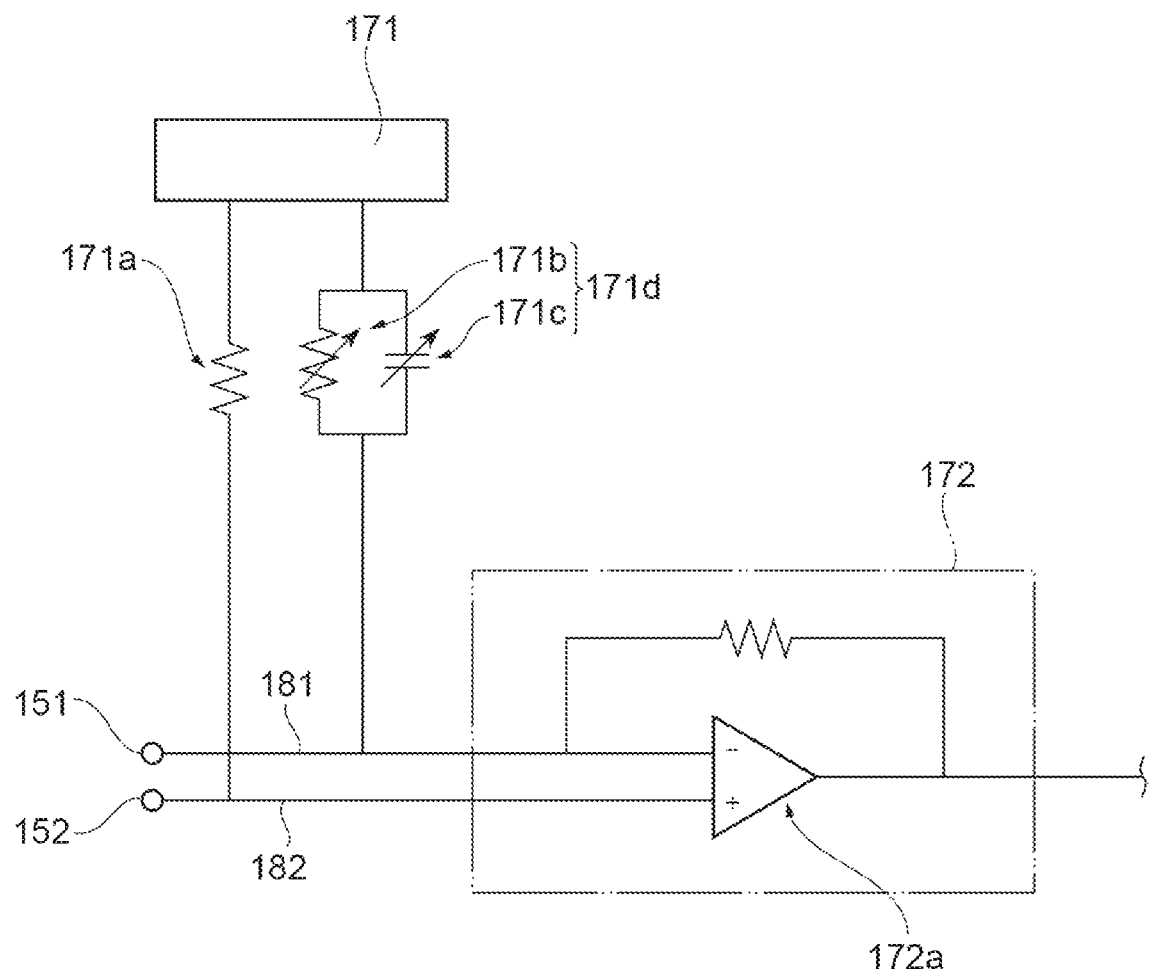
FIG. 13 is a diagram illustrating a detailed configuration of the circuit board of the measuring instrument.

Connections between the radio frequency oscillator 171 and the wiring 181 and between the wiring 182 and the C/V conversion circuit 172 will be described in more detail. FIG. 11 is a circuit diagram illustrating connections between the radio frequency oscillator 171 and the wiring 181 and between the wiring 182 and the C/V conversion circuit 172. As illustrated in FIG. 13, a resistor 171a is connected between the radio frequency oscillator 171 and the wiring 182. A phase adjustment circuit 171d including a variable resistor 171b and a variable capacitor 171c is connected between the radio frequency oscillator 171 and the wiring 181. The C/V conversion circuit 172 has an amplifier circuit 172a including an operational amplifier and a resistor as part thereof. In the amplifier circuit 172a, the wiring 181 is input to an inversion input of the operational amplifier, and the wiring 182 is input to a non-inversion input of the operational amplifier. In addition, the non-inversion input and the output of the operational amplifier are connected via the resistor. The amplifier circuit 172a amplifies a potential difference between the signal from the signal electrode 141 input to the C/V conversion circuit 172 and the signal from the guard electrode 142.

The radio frequency oscillator 171 and the wiring 281 and the wiring 282 and the C/V conversion circuit 272 are connected in the same manner as the radio frequency oscillator 171 and the wiring 181 and the wiring 182 and the C/V conversion circuit 172, respectively. That is, a resistor is connected between the radio frequency oscillator 171 and the wiring 282. A variable impedance circuit including a variable resistor and a variable capacitor is connected between the radio frequency oscillator 171 and the wiring 281. The C/V conversion circuit 272 has an amplifier circuit including an operational amplifier and a resistor as part thereof. In the amplifier circuit, the wiring 281 is input to the inversion input of the operational amplifier, and the wiring 282 is input to the non-inversion input of the operational amplifier. In addition, the non-inversion input and the output of the operational amplifier are connected via the resistor.

In the circuit configuration as described above, the amplitude of the signal from the signal electrode 141 can be changed by changing a resistance value of the variable resistor 171b of the phase adjustment circuit 171d. In addition, the phase of the signal from the signal electrode 141 can be changed by changing an electrostatic capacitance value of the variable capacitor 171c of the phase adjustment circuit 171d. In one exemplary embodiment, the processor 174 adjusts (controls) the resistance value of variable resistor 171b and the electrostatic capacitance value of the variable capacitor 171c to adjust an admittance of the phase adjustment circuit 171d.

For example, as so-called zero point adjustment, the processor 174 may adjust the resistance value of the variable resistor 171b and the capacity of the variable capacitor 171c in the phase adjustment circuit 171d so that the voltage signal output from the C/V conversion circuit 172 becomes zero. In addition, the resistance value of the variable resistor 171b and the capacity of the variable capacitor 171c in the phase adjustment circuit 171d may be adjusted so that the voltage signal output from the C/V conversion circuit 272 becomes zero.

The outputs of the C/V conversion circuit 172 and the C/V conversion circuit 272 are connected to the input of the A/D converter 173. In addition, the A/D converter 173 is connected to the processor 174. The A/D converter 173 is controlled by the control signal from the processor 174, converts the output signal (voltage signal) of the C/V conversion circuit 172 and the output signal (voltage signal) of the C/V conversion circuit 272 into digital values, and outputs the results to the processor 174 as detection values.

The storage device 175 is connected to the processor 174. The storage device 175 is a storage device such as a volatile memory, and is configured to store measurement data, for example. In addition, another storage device 178 is connected to the processor 174. The storage device 178 is a storage device such as a non-volatile memory, and stores, for example, a program read and executed by the processor 174.

The communication device 176 is a communication device compliant with any wireless communication standard. For example, the communication device 176 is compliant with Bluetooth®. The communication device 176 is configured to wirelessly transmit the measurement data stored in the storage device 175.

The processor 174 is configured to control each part of the measuring instrument 100 by executing the program described above. For example, the processor 174 controls the supply of the radio frequency signals from the radio frequency oscillator 171 to the guard electrode 142, the signal electrode 141, the signal electrode 161, and the guard electrode 162. In addition, the processor 174 controls the supply of the power from the power supply 177 to the storage device 175, the supply of the power from the power supply 177 to the communication device 176, and the like. Furthermore, the processor 174 acquires the measurement value of the first sensor 104 and the measurement value of the second sensor 105 based on the detection value input from the A/D converter 173 by executing the program described above. In an embodiment, when the detection value output from the A/D converter 173 is X, in the processor 174, the measurement value is acquired based on the detection value such that the measurement value becomes proportional to (a·X+b). Here, a and b are constants that change depending on the state of the circuit, and the like. The processor 174 may have, for example, a predetermined arithmetic expression (function) such that the measurement value becomes a value proportional to (a·X+b).

In the measuring instrument 100 as described above, in a state in which the measuring instrument 100 is disposed in a region surrounded by the edge ring ER, a plurality of signal electrodes 141 and the guard electrodes 142 face an inner edge of the edge ring ER. The measurement value generated based on the potential difference between the signal of the signal electrode 141 and the signal of the guard electrode 142 represents the electrostatic capacitance that reflects the distance between each of the plurality of signal electrodes 141 and the edge ring ER. The electrostatic capacitance C is represented by C=εS/d. ε is a dielectric constant of a medium between the front surface 141a of the signal electrode 141 and the inner edge of the edge ring ER, S is an area of the front surface 141a of the signal electrode 141, and d is a distance between the front surface 141a of the signal electrode 141 and the inner edge of the edge ring ER.

Therefore, according to the measuring instrument 100, measurement data that reflects the relative positional relationship between the measuring instrument 100 imitating the workpiece W and the edge ring ER can be obtained. For example, the plurality of measurement values acquired by the measuring instrument 100 become smaller as the distance between the front surface 141a of the signal electrode 141 and the inner edge of the edge ring ER becomes larger. Therefore, an amount of deviation of each signal electrode 141 in each radial direction of the edge ring ER can be obtained based on the measurement value representing the electrostatic capacitance of each signal electrode 141 of the first sensors 104A to 104C. Then, an error of the transport position of the measuring instrument 100 can be obtained from the amount of deviation of each signal electrode 141 of the first sensors 104A to 104C in each radial direction.

In addition, in a state in which the measuring instrument 100 is mounted on the electrostatic chuck ESC, a plurality of signal electrodes 161 and the guard electrodes 162 face the electrostatic chuck ESC. As described above, the electrostatic capacitance C is represented by C=εS/d. ε is a dielectric constant of a medium between the signal electrode 161 and the electrostatic chuck ESC, d is a distance between the signal electrode 161 and the electrostatic chuck ESC, and S is an area in which the signal electrode 161 and the electrostatic chuck ESC overlap each other in a plan view. The area S changes depending on a relative positional relationship between the measuring instrument 100 and the electrostatic chuck ESC. Therefore, according to the measuring instrument 100, the measurement data that reflects the relative positional relationship between the measuring instrument 100 imitating the workpiece W and the electrostatic chuck ESC can be obtained.

In an example, when the measuring instrument 100 is transported to a predetermined transport position, that is, a position on the electrostatic chuck ESC where the center of the electrostatic chuck ESC coincides with the center of the measuring instrument 100, the outer edge 161b of the signal electrode 161 and the edge of the electrostatic chuck ESC may coincide with each other. In this case, for example, since the transport position of the measuring instrument 100 is deviated from the predetermined transport position, when the signal electrode 161 is deviated outward in the radial direction with respect to the electrostatic chuck ESC, the area S decreases. That is, the electrostatic capacitance measured by the signal electrode 161 becomes smaller than the electrostatic capacitance when the measuring instrument 100 is transported to the predetermined transport position. Therefore, the amount of deviation of each signal electrode 161 of the electrostatic chuck ESC in each radial direction can be obtained based on the measurement value representing the electrostatic capacitance of each signal electrode 161 of the second sensors 105A to 105C. Then, an error of the transport position of the measuring instrument 100 can be obtained from the amount of deviation of each signal electrode 161 of the second sensors 105A to 105C in each radial direction.

As described above, the measuring instrument 100 includes the disc-shaped base board 101, the first sensor 104 provided on the base board 101, and the circuit board 106 provided on the base board 101. The first sensor 104 has the sensor body 140 including the signal electrode 141, the guard electrode 142, and the first ground electrode 143. The signal electrode 141 has the front surface intersecting the base board 101 in the radial direction. The guard electrode 142 is disposed on the rear side of the signal electrode 141 while being spaced apart from the signal electrode 141, and extends along the signal electrode 141. The first ground electrode 143 is disposed on the rear side of the guard electrode 142. The circuit board 106 includes the radio frequency oscillator 171 provided to apply the radio frequency signal to each of the signal electrode 141 and the guard electrode 142, and the C/V conversion circuit 172 configured to generate the voltage signal according to the electrostatic capacitance formed by the signal electrode 141. The C/V conversion circuit 172 has the amplifier circuit 172a including the operational amplifier. The radio frequency oscillator 171 is connected to the non-inversion input terminal of the operational amplifier so that the radio frequency signal applied to the signal electrode 141 is input to the non-inversion input terminal. In addition, the radio frequency oscillator 171 is connected to the inversion input terminal of the operational amplifier so that the radio frequency signal applied to the signal electrode 141 is input to the inversion input terminal. The first sensor 104 includes the second ground electrode 148 extending along the lower surface of the sensor body 140. The signal electrode 141, the guard electrode 142, and the first ground electrode 143 of the sensor body 140 all extend to the lower end of the sensor body 140. The space between the second ground electrode 148 and the sensor body 140 is filled with the insulating material. The space may be filled only with the insulating material.

In the measuring instrument 100 of the above embodiment, the rear side of the signal electrode 141 is shielded by the guard electrode 142 and the first ground electrode 143, and the lower side of the signal electrode 141 is shielded by the second ground electrode 148. Therefore, according to the first sensor 104, it is possible to measure the electrostatic capacitance with high directivity in a specific direction, that is, in the direction in which the front surface of the signal electrode 141 faces.

For example, it is conceivable to dispose the guard electrode on the lower side of the sensor body 140 in order to increase the shielding performance against the lower side of the sensor body 140. However, when the guard electrode extends along the lower surface of the sensor body 140, the operational amplifier may be broken by the ESD via the guard electrode. In one exemplary embodiment, no guard electrode is disposed on the lower side of the sensor body 140, and the guard electrode 142 constituting the sensor body 140 does not include a portion extending along the lower surface of the sensor body 140. That is, since the space between the second ground electrode 148 and the sensor body 140 is filled only with the insulating material, the ESD suppresses the operational amplifier from being broken via the guard electrode.

In one exemplary embodiment, in a plan view, the front surface of the signal electrode 141, the front surface of the guard electrode 142, and the front surface of the first ground electrode 143 may be all curved surfaces in parallel to a curved surface formed by the outer periphery of the base board 101. In this configuration, each of the signal electrode, guard electrode, and first ground electrode is also disposed in parallel to the edge ring. Therefore, it is possible to obtain a measurement value showing an accurate distance from the edge ring.

In one exemplary embodiment, the first sensor 104 may include the first flexible board 146 having insulating properties, extending along the lower surface of the sensor body 140, and including the second ground electrode 148. With this configuration, the second ground electrode 148 can be easily disposed on the lower side of the sensor body 140.

In one exemplary embodiment, the first sensor 104 may include the second flexible board 149 having insulating properties and extending along the upper surface of the sensor body 140. With this configuration, insulating properties on the upper surface of the sensor body 140 can be secured.

In one exemplary embodiment, the front surface 141*a* of the signal electrode 141 is covered with the insulating material 145 having electrical insulating properties. In this configuration, the ESD suppresses the operational amplifier from being broken via the signal electrode 141.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the aspects following claims.

What is claimed is:

1. A measuring instrument comprising: a disc-shaped base board; at least one sensor chip on the base board; and a circuit board on the base board,
    wherein the at least one sensor chip includes a sensor unit including a signal electrode having a front surface intersecting the base board in a radial direction, a guard electrode disposed on a rear side of the signal electrode while being spaced apart from the signal electrode and extending along the signal electrode, and a first ground electrode disposed on a rear side of the guard electrode,
    the circuit board includes
        a radio frequency oscillator configured to apply a radio frequency signal to each of the signal electrode and the guard electrode, and
        a C/V conversion circuit configured to generate a voltage signal according to an electrostatic capacitance formed by the signal electrode,
    the C/V conversion circuit has an amplifier circuit including an operational amplifier,
    the radio frequency oscillator is connected to a non-inversion input terminal of the operational amplifier so that the radio frequency signal applied to the guard electrode is input to the non-inversion input terminal, and is connected to an inversion input terminal of the operational amplifier so that the radio frequency signal applied to the signal electrode is input to the inversion input terminal,
    the at least one sensor chip includes a second ground electrode extending along a lower surface of the sensor unit,
    the signal electrode, the guard electrode, and the first ground electrode of the sensor unit all extend to a lower end of the sensor unit, and
    a space between the second ground electrode and the sensor unit is filled with a material having insulating properties.

2. The measuring instrument according to claim 1, wherein the space between the second ground electrode and the sensor unit is filled only with the material having insulating properties.

3. The measuring instrument according to claim 1, wherein the guard electrode constituting the sensor unit does not include a portion extending along the lower surface of the sensor unit.

4. The measuring instrument according to claim 1, wherein in a plan view, the front surface of the signal electrode, a front surface of the guard electrode, and a front surface of the first ground electrode are curved surfaces in parallel to a curved surface along an outer periphery of the base board.

5. The measuring instrument according to claim 1, wherein the at least one sensor chip includes a first flexible board having insulating properties, extending along the lower surface of the sensor unit, and including the second ground electrode.

6. The measuring instrument according to claim 1, wherein the at least one sensor chip includes a second flexible board having insulating properties and extending along an upper surface of the sensor unit.

7. The measuring instrument according to claim 1, wherein the front surface of the signal electrode is covered with an insulating material.

8. The measuring instrument according to claim 7, wherein the insulating material covering the front surface of the signal electrode is made of borosilicate glass or quartz.

9. The measuring instrument according to claim 1, wherein the at least one sensor chip is a plurality of sensors, and
    the plurality of sensors is arranged at equal intervals along an edge of the base board all around the edge.

10. The measuring instrument according to claim 1, wherein the at least one sensor chip is a plurality of sensors, and
    the plurality of sensors is provided along an edge on a top surface of the base board.

11. The measuring instrument according to claim 1, wherein the at least one sensor chip is a plurality of sensors, and
    a front end surface of each of the plurality of sensors is along a side surface of the base board.

12. The measuring instrument according to claim 1 further comprising:
    a plurality of bottom sensors provided along an edge on a bottom surface of the base board.

13. The measuring instrument according to claim 12, wherein the at least one sensor chip is a plurality of sensors, and
    each of the plurality of sensors and each of the plurality of bottom sensors are alternately arranged at intervals of 60° in a circumferential direction.

14. A method of measuring an electrostatic capacitance by using a measuring instrument in a chamber of a processing system,
wherein the processing system includes:
a process module having a chamber body for providing the chamber;
a transfer unit configured to transfer the measuring instrument into the chamber;
an electrostatic chuck provided in the chamber and on which the measuring instrument is mounted; and
an edge ring disposed so as to surround a peripheral edge of the electrostatic chuck;
wherein the measuring instrument includes:
a disc-shaped base board; at least one sensor chip on the base board; and a circuit board on the base board,
wherein the at least one sensor chip includes a sensor unit including a signal electrode having a front surface intersecting the base board in a radial direction, a guard electrode disposed on a rear side of the signal electrode while being spaced apart from the signal electrode and extending along the signal electrode, and a first ground electrode disposed on a rear side of the guard electrode,
the circuit board includes
a radio frequency oscillator configured to apply a radio frequency signal to each of the signal electrode and the guard electrode, and
a C/V conversion circuit configured to generate a voltage signal according to an electrostatic capacitance formed by the signal electrode,
the C/V conversion circuit has an amplifier circuit including an operational amplifier,
the radio frequency oscillator is connected to a non-inversion input terminal of the operational amplifier so that the radio frequency signal applied to the guard electrode is input to the non-inversion input terminal, and is connected to an inversion input terminal of the operational amplifier so that the radio frequency signal applied to the signal electrode is input to the inversion input terminal,
the at least one sensor chip includes a second ground electrode extending along a lower surface of the sensor unit,
the signal electrode, the guard electrode, and the first ground electrode of the sensor unit all extend to a lower end of the sensor unit, and
a space between the second ground electrode and the sensor unit is filled with a material having insulating properties
wherein the method comprises:
transferring the measuring instrument onto the electrostatic chuck using the transfer unit; and
generating at least one measurement value representing electrostatic capacitance by applying a radio frequency signal to the electrode in a state where the measuring instrument is placed on the electrostatic chuck;
wherein, in the generating the at least one measurement value, the signal electrode is shielded from a rear by the guard electrode and the first ground electrode, and is shielded from a lower part by the ground electrode.

* * * * *